United States Patent
Utani et al.

(10) Patent No.: US 9,130,546 B2
(45) Date of Patent: Sep. 8, 2015

(54) DRIVE CIRCUIT FOR SEMICONDUCTOR DEVICE

(71) Applicant: Mitsubishi Electric Corporation, Tokyo (JP)

(72) Inventors: Masayoshi Utani, Tokyo (JP); Mitsutaka Hano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/244,366

(22) Filed: Apr. 3, 2014

(65) Prior Publication Data

US 2015/0028925 A1    Jan. 29, 2015

(30) Foreign Application Priority Data

Jul. 26, 2013  (JP) ................. 2013-155543

(51) Int. Cl.
*H03B 1/00*   (2006.01)
*H03K 3/012*  (2006.01)
*H03K 17/687* (2006.01)
*H02M 1/08*   (2006.01)

(52) U.S. Cl.
CPC .............. *H03K 3/012* (2013.01); *H03K 17/687* (2013.01); *H02M 1/08* (2013.01); *H03K 2217/0036* (2013.01); *H03K 2217/0081* (2013.01)

(58) Field of Classification Search
USPC ................. 327/108–110, 427, 434, 437, 544
See application file for complete search history.

(56) References Cited

U.S. PATENT DOCUMENTS

| | | | |
|---|---|---|---|
| 7,269,492 B2 * | 9/2007 | Tanabe | 701/62 |
| 2003/0197543 A1 * | 10/2003 | Imai | 327/427 |
| 2003/0218186 A1 | 11/2003 | Hano | |
| 2011/0298446 A1 * | 12/2011 | Shiraki et al. | 324/126 |

FOREIGN PATENT DOCUMENTS

| | | |
|---|---|---|
| JP | 2004-047937 A | 2/2004 |
| JP | 2011-259529 A | 12/2011 |
| JP | 2011-259531 A | 12/2011 |

* cited by examiner

*Primary Examiner* — Long Nguyen
(74) *Attorney, Agent, or Firm* — Studebaker & Brackett PC

(57) ABSTRACT

A drive circuit is provided with an input terminal for receiving input signals, an output terminal that outputs drive signals generated from the input signals, a control power supply terminal that receives a control power supply voltage, an output terminal that outputs an output signal, and a reset terminal that receives a reset signal. The output signal is given to a gate of a MOSFET. A secondary side circuit and a MOSFET constitute a step-down chopper circuit, which steps down a voltage through duty ratio control of the gate drive signal and generates a control power supply voltage. Upon receipt of a reset signal, the drive circuit stops outputting the drive signal and changes the output signal so as to reduce the control power supply voltage VCC.

8 Claims, 6 Drawing Sheets

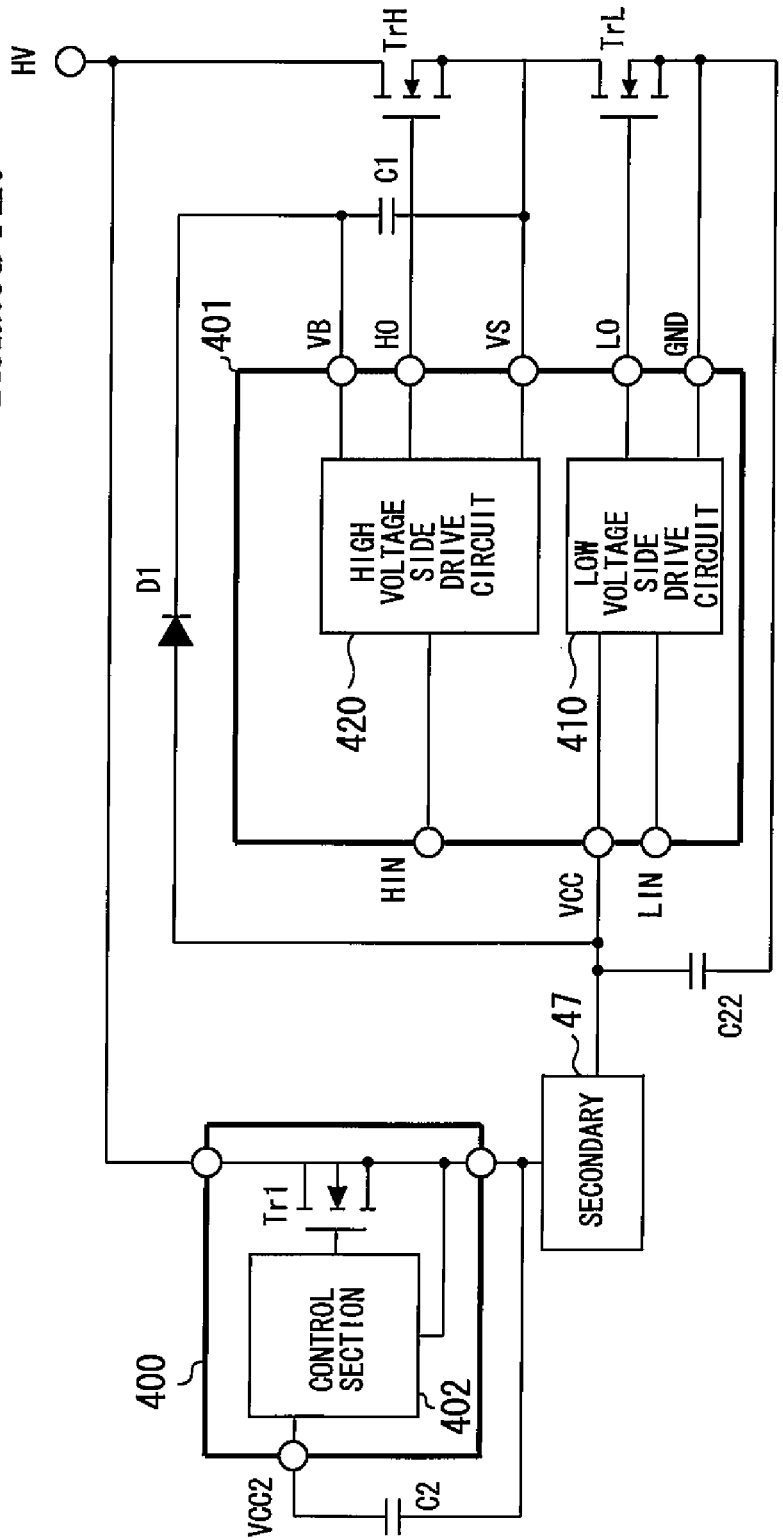
Fig. 6  *Related Art*

DRIVE CIRCUIT FOR SEMICONDUCTOR DEVICE

BACKGROUND OF THE INVENTION

1. Field of the Invention

The present invention relates to a drive circuit for a semiconductor device.

2. Background Art

Conventionally, as disclosed, for example, in Japanese Patent Laid-Open No. 2011-259529, a drive circuit for a semiconductor device is known which receives a supply of control power from a converter power supply circuit. The device according to this publication is more specifically an inverter circuit provided with a so-called arm circuit which is a set of semiconductor switching devices connected in series and a drive circuit that gives a drive signal to each semiconductor switching device of this arm circuit. This inverter circuit allows a load of a motor or the like to be driven.

Other prior art includes Japanese Laid-Open Patent Publication No. 2004-47937 and Japanese Laid-Open Patent Publication No. 2011-259531.

When a certain abnormality is detected in an inverter system including the above-described inverter circuit, the drive circuit generally stops outputting a drive signal thereof and stops driving the semiconductor switching device. This makes it possible to stop operation of the inverter system in the event of an abnormality and secure safety.

In the above prior art, control power is supplied from the converter power supply circuit to the drive circuit. This control power is generated through switching of another semiconductor switching device included in the converter power supply circuit. Conventionally, this converter drive circuit operates independently of the drive circuit.

In this case, even when the drive circuit stops output due to an abnormality in the inverter system, the converter drive circuit tries to continue to generate and supply the control power independently. As a result, this ends up being a waste of control power still being supplied to the drive circuit even in the event of an abnormality when the drive circuit stops output, unchanged from normal operation, and there is still room for improvement from the standpoint of reducing power consumption.

SUMMARY OF THE INVENTION

The present invention has been implemented to solve the above-described problem, and it is an object of the present invention to provide a drive circuit for a semiconductor device with reduced power consumption.

According to one aspect of the present invention, a drive circuit for a semiconductor device includes: an input terminal for receiving an input signal; a first output terminal that outputs a drive signal generated from the input signal; a control power supply terminal that is connected to a power supply generation device and receives a control power supply voltage from the power supply generation device; a second output terminal that is connected to the power supply generation device and gives an output signal to the power supply generation device; and a reset signal terminal that receives a first reset signal. Upon receipt of the first reset signal, output of the drive signal is stopped and the output signal is changed so that the power supply generation device reduces the control power supply voltage.

Other and further objects, features and advantages of the invention will appear more fully from the following description.

BRIEF DESCRIPTION OF THE DRAWINGS

FIG. 6 is a circuit diagram illustrating a configuration of a semiconductor device used to describe problems of embodiments of the present invention.

DETAILED DESCRIPTION OF THE PREFERRED EMBODIMENT

First Embodiment

Figure 1:
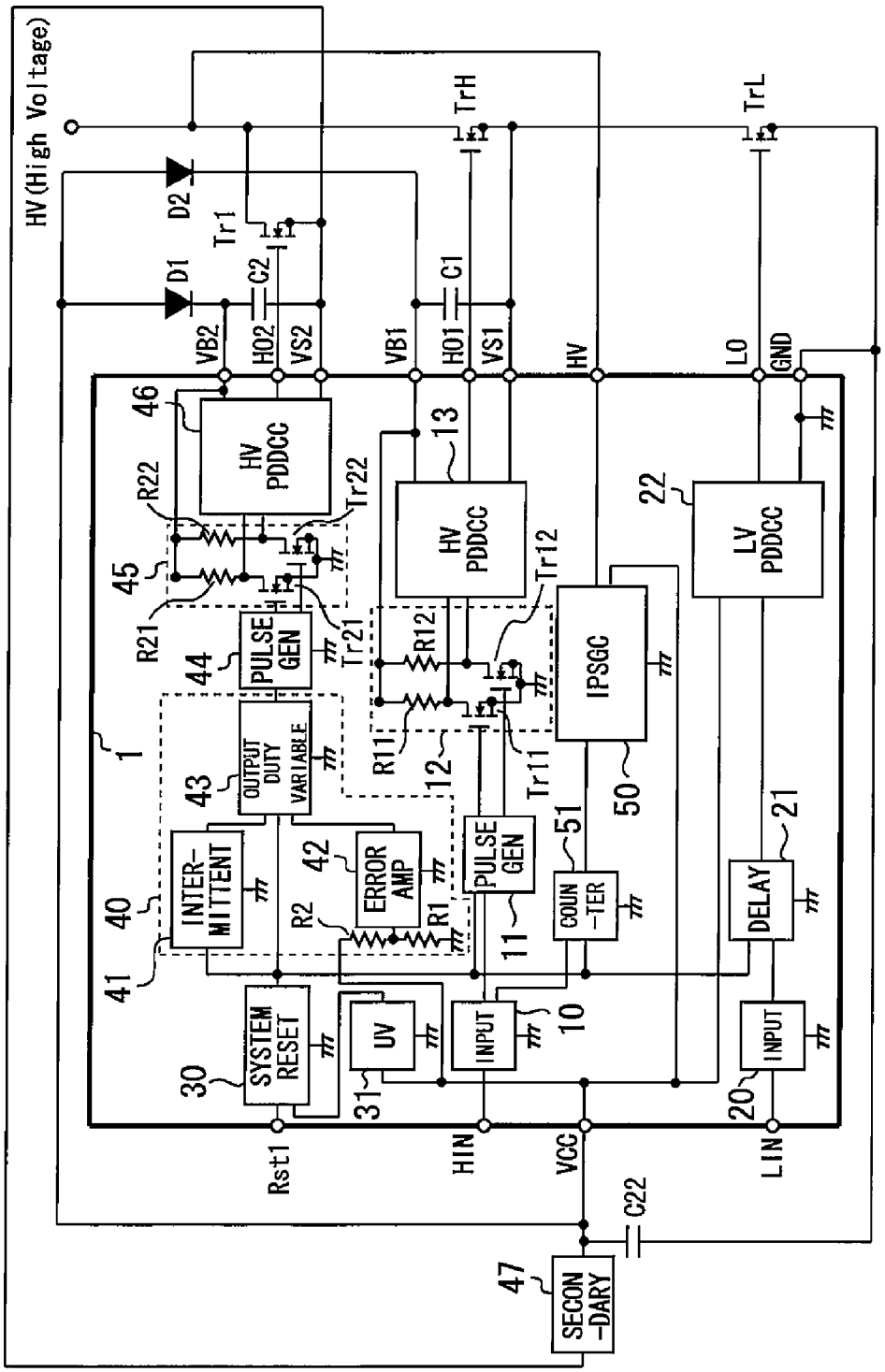
FIG. 1 is a circuit diagram illustrating a configuration of a drive circuit for a semiconductor device according to a first embodiment of the present invention.

FIG. 1 is a circuit diagram illustrating a configuration of a drive circuit 1 for semiconductor device according to a first embodiment of the present invention. FIG. 1 illustrates the drive circuit 1 together with its peripheral circuits.

The drive circuit 1 is provided with an input terminal for receiving input signals HIN and LIN, and an output terminal that outputs drive signals HO1 and LO generated from the input signals HIN and LIN. The drive circuit 1 is provided with an internal circuit for generating the drive signals HO1 and LO from the input signals HIN and LIN. The drive circuit 1 is further provided with a control power supply terminal that receives a control power supply voltage VCC, an output terminal that outputs an output signal HO2 and a reset terminal that receives a reset signal Rst1.

The control power supply terminal is connected to a secondary side circuit 47 and receives the control power supply voltage VCC from this secondary side circuit 47. More specifically, the reset signal Rst1 is a signal given to the drive circuit 1 when a high order control microcomputer or the like (not shown) detects a system abnormality. One end of a capacitor C22 is connected between the secondary side circuit 47 and the control power supply terminal, and the other end of the capacitor C22 is connected to a ground GND.

The drive circuit 1 drives MOS field-effect transistors (i.e. MOSFETs) TrH and TrL which are semiconductor switching devices. The MOSFETs TrH and TrL are connected like a totem pole and constitute a so-called arm circuit. A drain of the MOSFET TrH is connected to a main power supply HV. A source of the MOSFET TrH is connected to a drain of the MOSFET TrL.

A source of the MOSFET TrL is connected to the ground GND. A source potential of the MOSFET TrH is a reference potential VS1. An output signal HO1 is supplied to a gate of the MOSFET TrH on a high-voltage side and an output signal LO is supplied to a gate of the MOSFET TrL on a low-voltage side.

An output signal HO2 as a gate drive signal is given to a gate of a MOSFET Tr1 to perform PWM control. The secondary side circuit 47 and the MOSFET Tr1 constitute a step-down chopper circuit. The step-down chopper circuit made up of this MOSFET Tr1 and the secondary side circuit 47 steps down a voltage through duty ratio control of the gate drive signal HO2, and can generate a control power supply voltage VCC, for example, on the order of 15 V.

The drive circuit 1 is provided with terminals respectively connected to reference potentials VS1 and VS2, terminals respectively connected to power supplies VB1 and VB2, and a terminal connected to the ground GND. The power supply VB2 is supplied from an intermediate point between a cathode of a diode D1 and one end of a capacitor C2.

The power supply VB1 is supplied from an intermediate point between a cathode of the diode D2 and one end of a capacitor C1. Respective anodes of the diodes D1 and D2 are connected to the control power supply voltage VCC. The other end of the capacitor C2 is connected to the reference potential VS2 and the other end of the capacitor C1 is connected to the reference potential VS1. This constitutes a so-called boot strap circuit.

Now, the inner circuit of the drive circuit 1 will be described. On the high-voltage side, the drive circuit 1 is provided with an input circuit 10, a pulse generation circuit (pulse generator) 11, a high-voltage level shift circuit 12 and a high-voltage side power device drive control circuit 13. In FIG. 1, a circuit block having "HV PDDCC" therein with reference numeral 13 corresponds to the high-voltage side power device drive control circuit 13. The input circuit 10 shapes a waveform of the input signal HIN to generate a pulse waveform and inputs the pulse waveform to the pulse generation circuit 11. The pulse generation circuit 11 is a so-called one-shot pulse circuit, and outputs an on one-shot pulse synchronized with a rising edge of the inputted pulse and an off one-shot pulse synchronized with a falling edge of the inputted pulse respectively.

The high-voltage level shift circuit 12 receives the on one-shot pulse and the off one-shot pulse of the pulse generation circuit 11. Here, the high-voltage level shift circuit 12 is provided with MOSFETs Tr11 and Tr12, and resistors R11 and R12. One end of the resistor R11 is connected to a drain of the MOSFET Tr11 and the other end of the resistor R11 is connected to the power supply VB1.

One end of the resistor R12 is connected to a drain of the MOSFET Tr12, and the other end of the resistor R12 is also connected to the power supply VB1. Both sources of the MOSFETs Tr11 and Tr12 are connected to the ground. In the present embodiment, the on one-shot pulse is inputted to a gate of the MOSFET Tr11 and the off one-shot pulse is inputted to a gate of the MOSFET Tr12.

The output of the high-voltage level shift circuit 12 is inputted to the high-voltage side power device drive control circuit 13. The output of the high-voltage level shift circuit 12 will be described more specifically. A first output signal is outputted from a connection point between one end of the resistor R11 and the drain of the MOSFET Tr11, and a second output signal is outputted from a connection point between one end of the resistor R12 and the drain of the MOSFET Tr12.

The first and second output signals correspond to signals obtained by level-shifting the on one-shot pulse and the off one-shot pulse respectively. The high-voltage side power device drive control circuit 13 generates and outputs a pulse signal obtained by combining the first and second output signals as the drive signal HO1. More specifically, this combination is equivalent to generating a pulse waveform which rises in synchronization with the first output signal and falls in synchronization with the second output signal.

As for the low-voltage side, the drive circuit 1 is provided with an input circuit 20, a delay circuit 21 and a low-voltage side power device drive control circuit 22. In FIG. 1, a circuit block having "LV PDDCC" therein with reference numeral 22 corresponds to the low-voltage side power device drive control circuit 22. The input signal LIN is inputted to the input circuit 20. The input circuit 20 shapes a waveform of this input signal LIN, thereby generates a pulse waveform and inputs the pulse waveform to the delay circuit 21.

The delay circuit 21 delays the pulse signal from the input circuit 20 in accordance with a delay time in the high-voltage level shift circuit 12 in the high-voltage side circuit. The low-voltage side power device drive control circuit 22 receives the pulse signal whose delay has been adjusted in the delay circuit 21, and generates and outputs a drive signal LO.

The drive circuit 1 is provided with a system reset circuit 30, a UV (under voltage) circuit 31, a power supply control circuit 40, a pulse generation circuit 44, a high-voltage level shift circuit 45 and a high-voltage side power device drive control circuit 46. In FIG. 1, a circuit block having "HV PDDCC" therein with reference numeral 46 corresponds to the high-voltage side power device drive control circuit 46. The system reset circuit 30 receives the reset signal Rst1. The UV circuit 31 operates using the control power supply voltage VCC as a power supply and can input a detection signal to the system reset circuit 30 when this control power supply voltage VCC falls to a predetermined value or below.

The system reset circuit 30 is connected to an intermittent operation circuit 41, an output duty variable circuit 43, the pulse generation circuit 11, a counter circuit 51 and the delay circuit 21. When the reset signal Rst1 is inputted or when a detection signal is inputted from the UV circuit 31, the system reset circuit 30 assumes that a system abnormality has occurred, sends signals to the above-described circuits connected to the system reset circuit 30 and causes the respective circuits to perform protective operation in the event of an abnormality.

More specifically, in the event of an abnormality, a signal is transmitted from the system reset circuit 30 to the intermittent operation circuit 41 and the output duty variable circuit 43, which prevents driving of the MOSFET Tr1 and reduces the control power supply voltage VCC. Furthermore, in the event of an abnormality, a signal is transmitted from the system reset circuit 30 to the pulse generation circuit 11 and the delay circuit 21, which stops transmissions of signals to sections after those respective circuits and stops the supplies of drive signals to the MOSFETs TrH and TrL. Action of stopping, for example, an initial power supply generation circuit 50 is also taken for the counter circuit 51 as a protection operation in the event of an abnormality. In FIG. 1, a circuit block having "IPSGC" therein with reference numeral 50 corresponds to the initial power supply generation circuit 50.

The power supply control circuit 40 is provided before the high-voltage level shift circuit 45. The power supply control circuit 40 generates a pulse signal to control the MOSFET Tr1 which is part of the circuit for generating the aforementioned control power supply voltage VCC.

More specifically, the power supply control circuit 40 is provided with the intermittent operation circuit 41, an error amplifier circuit 42 and the output duty variable circuit 43. The intermittent operation circuit 41, the error amplifier circuit 42 and the output duty variable circuit 43 all operate using the control power supply voltage VCC as a power supply. The output of the output duty variable circuit 43 is inputted to the high-voltage side power device drive control circuit 46 via the pulse generation circuit 44 and the high-voltage level shift circuit 45.

The pulse generation circuit 44 is a one-shot pulse circuit as in the case of the pulse generation circuit 11, and outputs an on one-shot pulse synchronized with a rising edge of an inputted pulse and an off one-shot pulse synchronized with a falling edge of the inputted pulse respectively. The high-voltage level shift circuit 45 receives the on one-shot pulse and the off one-shot pulse of the pulse generation circuit 44.

Here, the high-voltage level shift circuit 45 is provided with MOSFETs Tr21 and Tr22, and resistors R21 and R22.

The on one-shot pulse and the off one-shot pulse of the pulse generation circuit 44 are inputted to the high-voltage level shift circuit 45. Here, the high-voltage level shift circuit 45 is provided with the MOSFETs Tr21 and Tr22, and the resistors R21 and R22.

One end of the resistor R21 is connected to the drain of the MOSFET Tr21 and the other end of the resistor R21 is connected to the power supply VB2. One end of the resistor R22 is connected to the drain of the MOSFET Tr22 and the other end of the resistor R22 is also connected to the power supply VB2.

The sources of the MOSFETs Tr21 and Tr22 are both connected to the ground. In the present embodiment, the on one-shot pulse is inputted to the gate of the MOSFET Tr21 and the off one-shot pulse is inputted to the gate of the MOSFET Tr22.

The output of the high-voltage level shift circuit 45 is inputted to the high-voltage side power device drive control circuit 46. The output of the high-voltage level shift circuit 45 will be described more specifically. A third output signal is outputted from a connection point between one end of the resistor R21 and the drain of the MOSFET Tr21, and a fourth output signal is outputted from a connection point between one end of the resistor R22 and the drain of the MOSFET Tr22.

The third and fourth output signals are signals obtained by level-shifting the on one-shot pulse and the off one-shot pulse respectively. The high-voltage side power device control circuit 46 generates and outputs a pulse signal obtained by combining the third and fourth output signals as the drive signal HO2. More specifically, this combination is equivalent to generating a pulse waveform which rises in synchronization with the third output signal and falls in synchronization with the fourth output signal.

Switching of the MOSFET Tr1 is controlled by this drive signal HO2. As a result, the step-down chopper circuit made up of the MOSFET Tr1 and the secondary side circuit 47 is activated and the control power supply voltage VCC is generated.

The error amplifier circuit 42 receives voltage values obtained by dividing the control power supply voltage VCC by the resistors R1 and R2 and monitors the control power supply voltage VCC. The monitoring result is given from the error amplifier circuit 42 to the output duty variable circuit 43. In this way, the output duty variable circuit 43 manages the drive signal of the MOSFET Tr1 to an appropriate duty ratio so that the control power supply voltage VCC matches a desired value (e.g., 15 V).

Upon receipt of the reset signal Rst1, the drive circuit 1 stops outputting the drive signal HO1 and changes the output signal HO2 so as to reduce the control power supply voltage VCC. Power consumption can thereby be reduced.

That is, in the drive circuit 1 according to the first embodiment, when the output duty variable circuit 43 receives a signal from the system reset circuit 30, the output duty variable circuit 43 reduces the duty of pulse signals so as to reduce the control power supply voltage VCC. Particularly since the power supply control circuit 40 is placed before the high-voltage level shift circuit 45 in the drive circuit 1, the control accuracy thereof can be increased.

Upon receipt of a signal from the system reset circuit 30, the intermittent operation circuit 41 makes the output of the output duty variable circuit 43 intermittent. "Making intermittent" means forcibly generating an off period at regular periods. This makes it possible to reduce the control power supply voltage VCC to a voltage further lower than the control power supply voltage VCC when the output duty variable circuit 43 has a minimum duty ratio that can be realized.

Particularly, in the present embodiment, assume that when a signal from the system reset circuit 30 is received, the control power supply voltage VCC is reduced down to a minimum operating voltage of the UV circuit 31. This makes it possible to save power consumption to a minimum while securing the voltage abnormality detection function.

Note that the drive circuit 1 is provided with the initial power supply generation circuit 50 and the counter circuit 51. The initial power supply generation circuit 50 is intended for the low-voltage side to generate a power supply at the time of startup. The counter circuit 51 is intended to generate a signal for stopping the initial power supply generation circuit 50 when the input signal HIN turns ON a predetermined number of times. This can stabilize the power supply voltage for a predetermined period immediately after the startup.

According to the first embodiment described above, upon receipt of a signal from the system reset circuit 30 in the event of an abnormality, the drive circuit 1 stops the output of the drive signal HO1 and changes the output signal HO2 so as to reduce the control power supply voltage VCC. More specifically, the drive circuit 1 reduces the duty ratio of the output signal HO2 as the gate drive signal and makes the output signal HO2 intermittent. This makes it possible to reduce power consumption.

Note that the present embodiment provides the UV circuit 31 that outputs a detection signal when the value of the control power supply current VCC is a predetermined value or below as an abnormality detection circuit that detects an abnormality in the drive circuit 1. However, as the abnormality detection circuit, an OT circuit may also be provided which detects whether or not a temperature in the drive circuit 1 is a predetermined value or above. This allows a temperature abnormality to be detected.

Furthermore, the intermittent operation circuit 41 may not necessarily be provided. This is because as long as the control power supply voltage VCC can be sufficiently reduced by the output duty variable circuit 43 alone, it is not necessary to make pulse signals intermittent.

FIG. 6 is a circuit diagram illustrating a configuration of a semiconductor device used to describe problems of embodiments of the present invention. In FIG. 6, a configuration assigned the same reference numerals as those in FIG. 1 shows the same configuration as that in FIG. 1. A drive circuit 401 in FIG. 6 is provided with a high-voltage side drive circuit and a low-voltage side drive circuit as in the case of the drive circuit 1 in FIG. 1, which drive two semiconductor switching devices (MOSFETs TrH and TrL).

In FIG. 6, a secondary side circuit 47 and a MOSFET Tr1 constitute a converter circuit, which is a step-down chopper circuit. An IPD 400 is provided with a control section 402 that generates a gate drive signal of the MOSFET Tr1.

In the circuit in FIG. 6, a control power supply voltage VCC is generated by switching ON/OFF the MOSFET Tr1. In FIG. 6, the control section 402 is independent of the drive circuit 401. In this case, even when the output of the drive circuit 401 is stopped due to a system abnormality, the control section 402 of the IPD 400 independently continues to generate and supply the control power supply voltage VCC. As a result, this ends up being a waste of control power still being supplied to the drive circuit 401, unchanged from normal operation.

In this respect, according to the drive circuit 1 according to the first embodiment, a reset signal Rst1 is received or an abnormality of the UV circuit 31 is detected in the event of a system abnormality, and output of the drive circuit 1 is stopped via the system reset circuit 30. Furthermore, the drive circuit 1 can adjust PWM control of the MOSFET Tr1 and reduce the control power supply voltage VCC by adjusting the output signal HO2. This makes it possible to reduce power consumption. Note that a comparison of a drive circuit 3 according to a third embodiment in particular, which will be described later, with the configuration in FIG. 6 will also facilitate an understanding of a difference between the configuration in the comparative example in FIG. 6 and that of the present embodiment of the invention.

Second Embodiment

Figure 2:
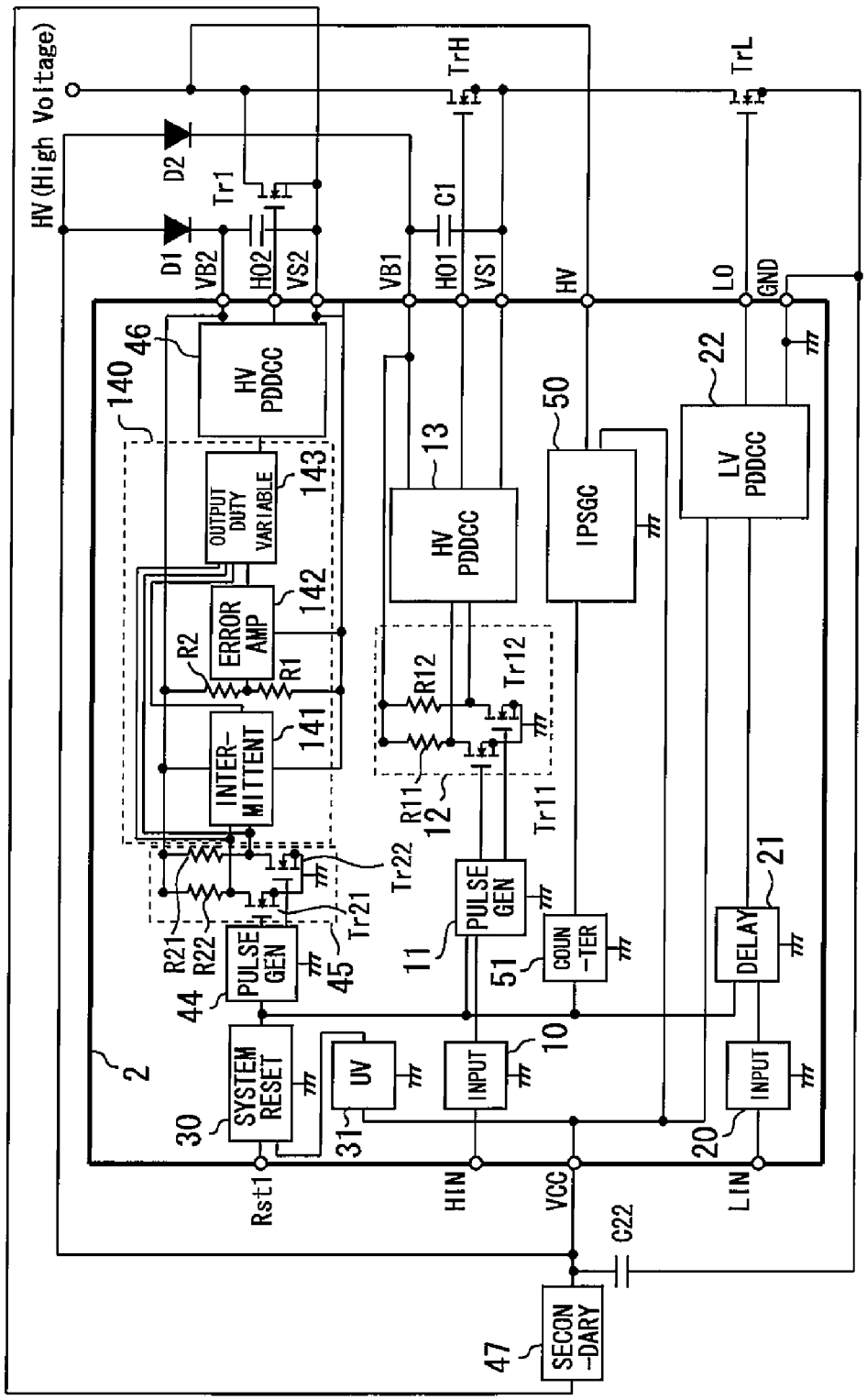
FIG. 2 is a circuit diagram illustrating a configuration of a drive circuit for a semiconductor device according to a second embodiment of the present invention.

FIG. 2 is a circuit diagram illustrating a configuration of a drive circuit 2 for semiconductor device according to a second embodiment of the present invention. The drive circuit 2 is provided with the same circuit configuration as that of the drive circuit 1 according to the first embodiment except in that the circuits after the system reset circuit 30 have been changed. Therefore, in the following description, components identical or equivalent to those in the first embodiment will be described with the same reference numerals assigned thereto, and at the same time, description will be focused on differences from the first embodiment, whereas description of common items will be simplified or omitted.

In the first embodiment, the power supply control circuit 40 is placed before the high-voltage level shift circuit 45. However, in the second embodiment, a power supply control circuit 140 is placed after the high-voltage level shift circuit 45, that is, in a high-voltage land.

Like the power supply control circuit 40, the power supply control circuit 140 is provided with an intermittent operation circuit 141, an error amplifier circuit 142 and an output duty variable circuit 143. The intermittent operation circuit 141, the error amplifier circuit 142 and the output duty variable circuit 143 receive a power supply from the power supply VB2 and are connected to the reference potential VS2 as well.

In the drive circuit 2, the output of the system reset circuit 30 is inputted to the pulse generation circuit 44. This causes an on one-shot pulse synchronized with a rising edge of the output signal of the system reset circuit 30 and an off one-shot pulse synchronized with a falling edge of the output signal of the system reset circuit 30 to be level-shifted respectively and inputted to the intermittent operation circuit 141.

The intermittent operation circuit 141 starts an intermittent operation in accordance with the on one-shot pulse from the high-voltage level shift circuit 45 and stops the intermittent operation in accordance with the off one-shot pulse from the high-voltage level shift circuit 45. The output duty variable circuit 143 also starts reducing the duty ratio in accordance with the on one-shot pulse from the high-voltage level shift circuit 45 and stops reducing the duty ratio in accordance with the off one-shot pulse from the high-voltage level shift circuit 45. By this means, it is possible to reduce the control power supply voltage VCC in the event of a system abnormality and reduce power consumption.

Third Embodiment

Figure 3:
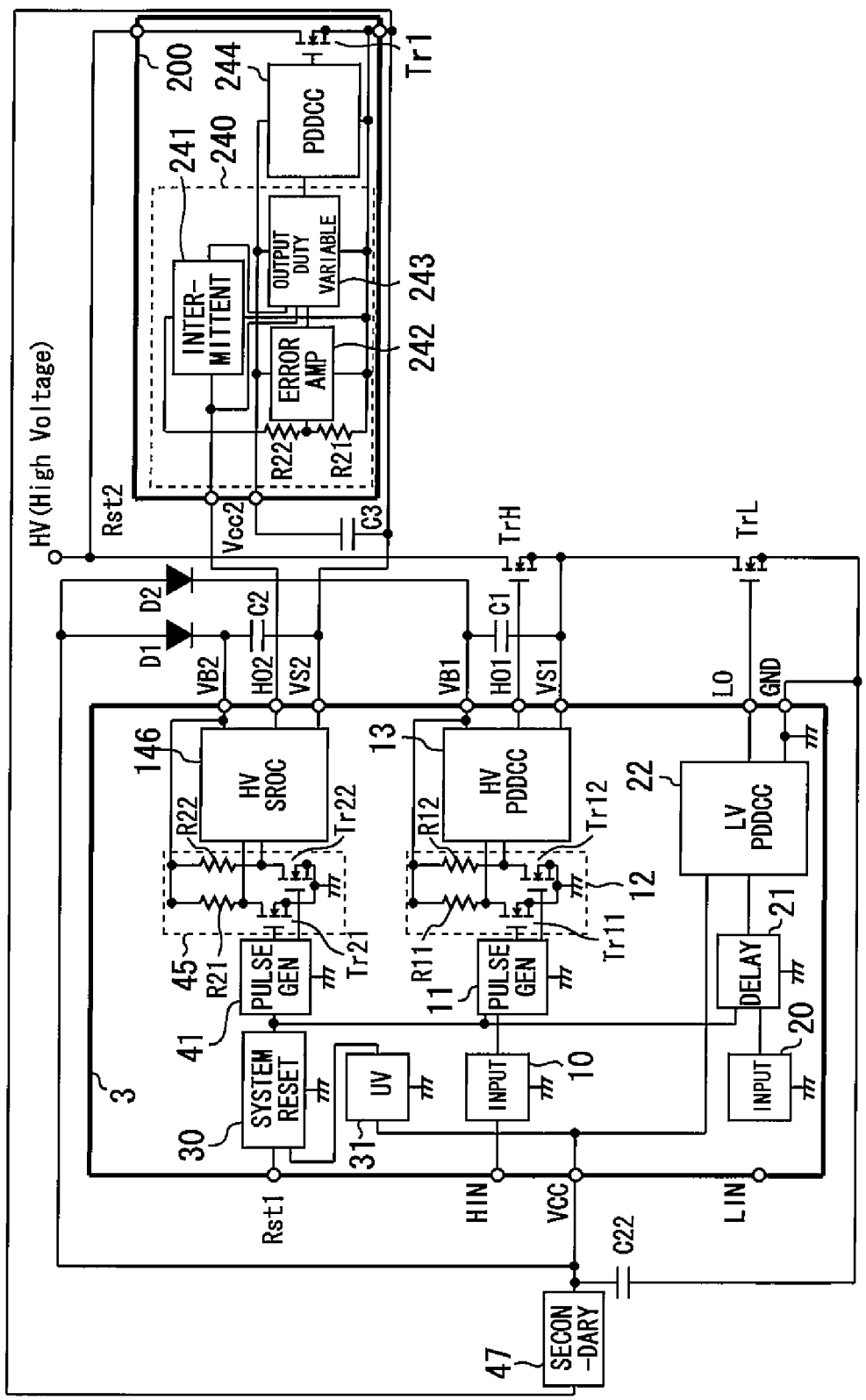
FIG. 3 is a circuit diagram illustrating a configuration of a drive circuit for a semiconductor device according to a third embodiment of the present invention.

FIG. 3 is a circuit diagram illustrating a configuration of a drive circuit 3 for semiconductor device according to a third embodiment of the present invention. In the drive circuit 3, a power supply control circuit 240 is arranged outside the drive circuit 3 as an independent circuit. The drive circuit 3 is provided with a high-voltage side system reset output circuit 146 instead of the high-voltage side power device drive control circuit 46. In FIG. 3, a circuit block having "HV SROC" therein with reference numeral 146 corresponds to the high-voltage side system reset output circuit 146.

The drive circuit 3 is provided with neither initial power supply generation circuit 50 nor counter circuit 51. In these respects, the drive circuit 3 is different from the drive circuit 1 according to the first embodiment. In the following description, components identical or equivalent to those in the first embodiment will be described with the same reference numerals assigned thereto, and at the same time, description will be focused on differences from the first embodiment, whereas description of common items will be simplified or omitted.

The drive circuit 3 is connected to an intelligent power device (IPD) 200.

The IPD 200 is provided with an intermittent operation circuit 241, an error amplifier circuit 242, and an output duty variable circuit 243, which constitute the power supply control circuit 240. The IPD 200 is further provided with a power device drive control circuit 244 and a MOSFET Tr1. In FIG. 3, a circuit block having "PDDCC" therein with reference numeral 244 corresponds to the power device drive control circuit 244. The IPD 200 can perform PWM control on the MOSFET Tr1 using a pulse signal outputted from the output duty variable circuit 243.

The IPD 200 is provided with a terminal that receives a control section power supply VCC2 and a terminal that receives a reset signal Rst2. The terminal that receives the control section power supply VCC2 is connected to one end of a capacitor C3 and the other end of the capacitor C3 is connected to a source of the MOSFET Tr1.

Note that the control section power supply VCC2 is a power supply generated by a power supply circuit (not shown) incorporated in the IPD 200 from a drain potential of the MOSFET Tr1. Furthermore, though not shown, the terminal that receives the control section power supply VCC2 is connected to the terminal that receives a control power supply voltage VCC of the drive circuit 3 via a circuit such as a diode. By this means, when the control power supply voltage VCC changes, the control section power supply VCC2 also changes in accordance with the change. Therefore, the power supply control circuit 240 monitors the change of the control section power supply VCC2, and can thereby monitor the control power supply voltage VCC.

Note that this control section power supply VCC2 is divided by resistors R21 and R22 and inputted to the error amplifier circuit 242. The error amplifier circuit 242 monitors the control section power supply VCC2, thereby monitors the control power supply voltage VCC and feeds it back to the output duty variable circuit 243. As a result, the duty ratio of a pulse signal outputted from the output duty variable circuit 243 (that is, a gate drive signal of the MOSFET Tr1) is managed appropriately.

In the third embodiment, the output signal HO2 is inputted to the IPD 200 as the reset signal Rst2. This differs from the first and second embodiments in that the output signal HO2 is supplied as the gate drive signal of the MOSFET Tr1.

The reset signal Rst2 is a signal that instructs the IPD 200 to reduce the control power supply voltage VCC. More specifically, this reset signal Rst2 is a signal that instructs the power supply control circuit 240 to reduce the duty ratio of the gate drive signal of the MOSFET Tr1 and make this gate drive signal intermittent.

That is, when the reset signal Rst2 is switched from a normal state (e.g., high) to an abnormal state (e.g., low), the signal is given to the intermittent operation circuit 241 and the output duty variable circuit 243. The intermittent operation circuit 241 and the output duty variable circuit 243 then perform an operation similar to the operation performed by the intermittent operation circuit 41 and the output duty variable circuit 43 in the first embodiment by receiving a signal from the system reset circuit 30. As a result, it is possible to reduce the duty ratio of the gate drive signal of the MOSFET Tr1 and make this gate drive signal intermittent. It is thereby possible to reduce the control power supply voltage VCC in the event of a system abnormality and reduce power consumption.

Fourth Embodiment

Figure 4:
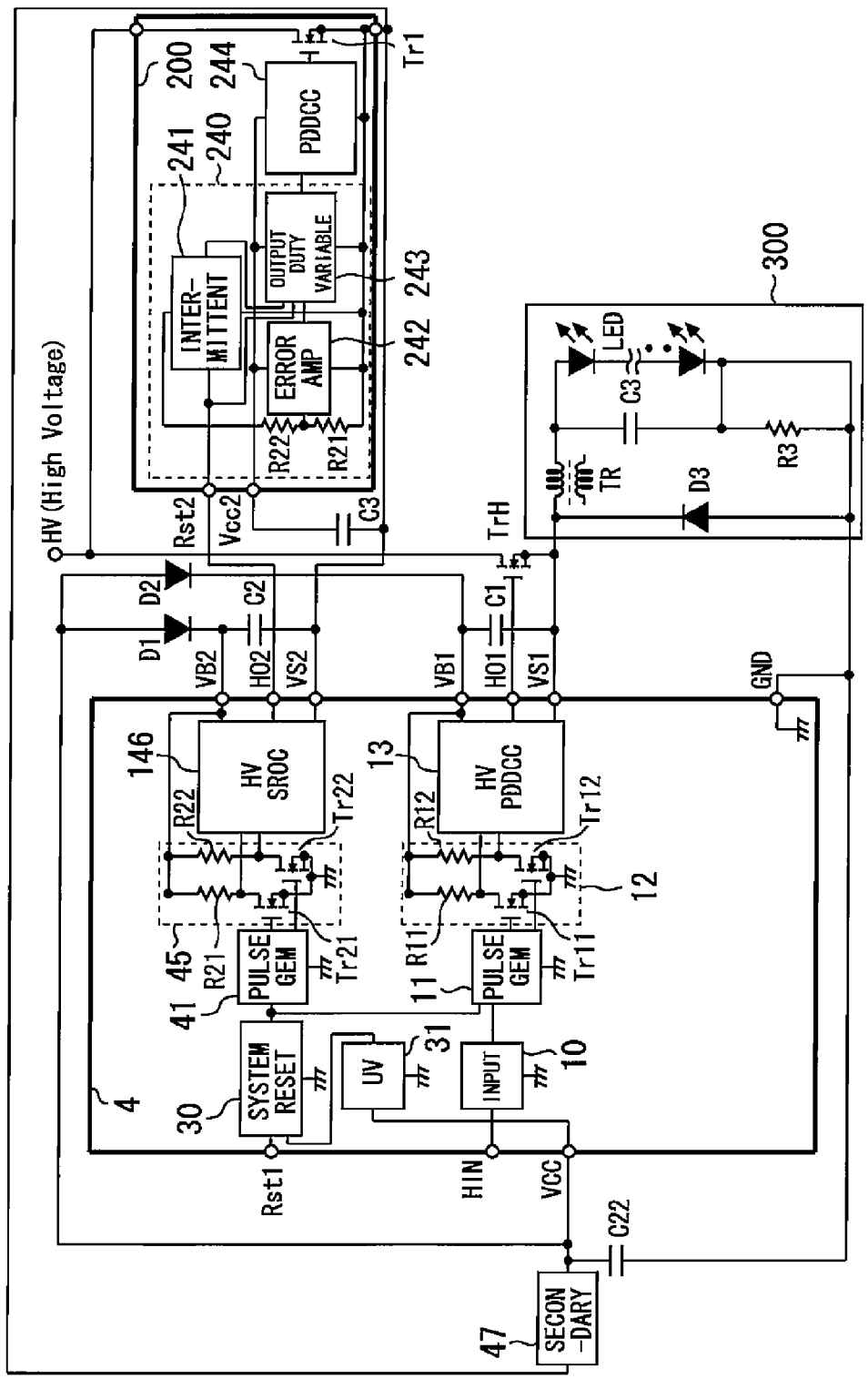
FIG. 4 is a circuit diagram illustrating a configuration of a drive circuit for a semiconductor device according to a fourth embodiment of the present invention.

FIG. 4 is a circuit diagram illustrating a configuration of a drive circuit 4 for semiconductor device according to a fourth embodiment of the present invention. The drive circuit 4 is provided with a configuration similar to that of the drive circuit 3 according to the third embodiment except for not including any power device drive control circuit or the like on the low-voltage side.

Furthermore, the present embodiment differs from the above-described embodiments in that the MOSFET TrH is the only semiconductor switching device to which the drive circuit 4 is connected and this MOSFET TrH is connected to an LED power supply 300. In the following description, components identical or equivalent to those in the third embodiment will be described with the same reference numerals assigned thereto, and at the same time, description will be focused on differences from the third embodiment, whereas description of common items will be simplified or omitted.

The LED power supply 300 is a lighting circuit that supplies a DC current to a plurality of light-emitting diode LEDs connected in series and is provided with a diode D3, a transformer TR as an inductor element, a capacitor C3 and a resistor R3. An anode of the diode D3 is connected to a ground GND and a cathode of the diode D3 is connected to one end of the transformer TR. The other end of the transformer TR is connected to one end of the capacitor C3 and an anode of the light-emitting diode LED. The other end of the capacitor C3 is connected to one end of the resistor R3 and the other end of the resistor R3 is connected to the ground.

Note that various circuits such as an LED current detection circuit and an LED voltage detection circuit may also be provided, but those circuits are omitted in the present embodiment. A source of the MOSFET TrH is connected to a cathode of the diode D3, which functions as a switching device. Thus, the drive circuit 4 can also be used for application of controlling the LED power supply 300.

Fifth Embodiment

Figure 5:
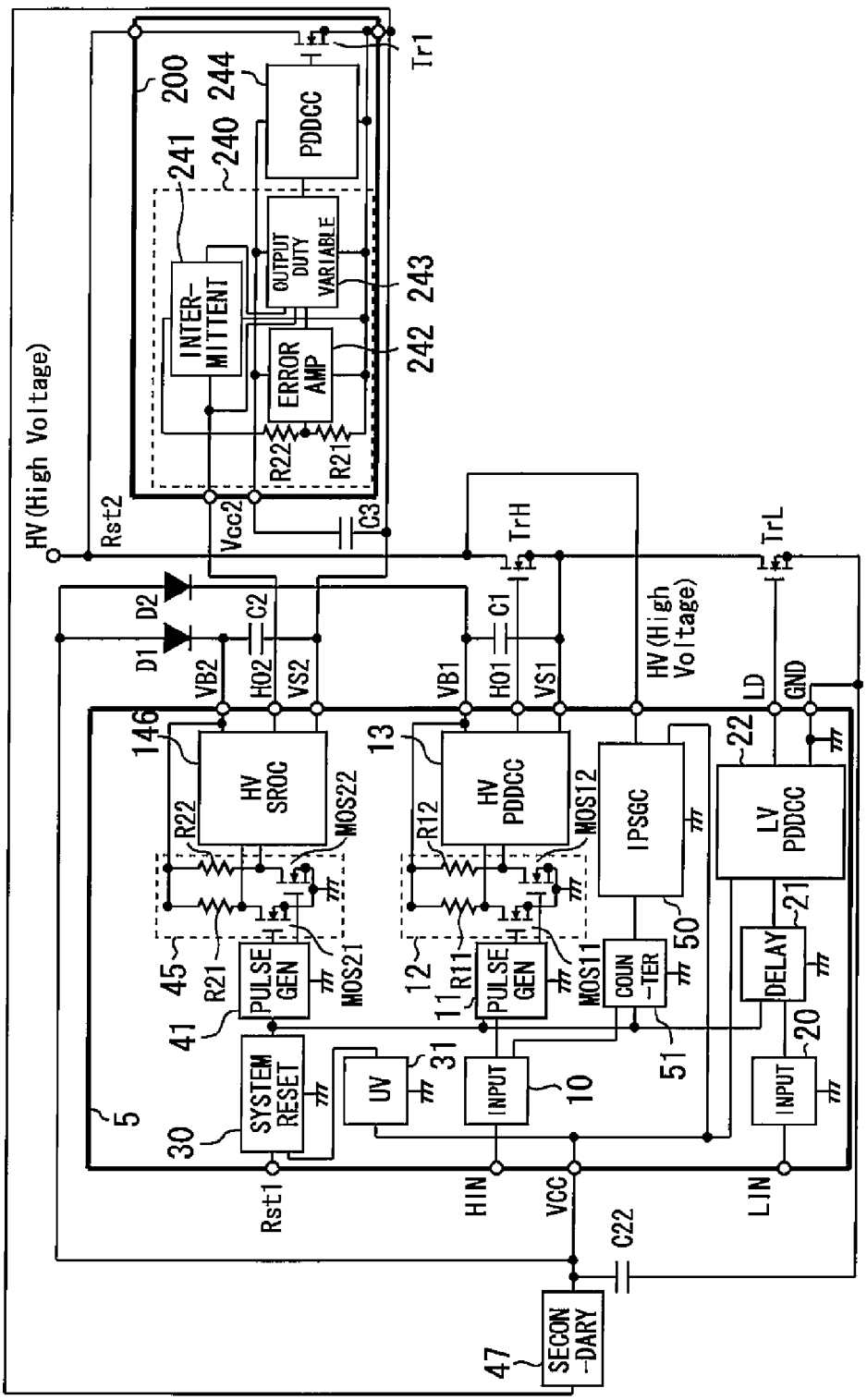
FIG. 5 is a circuit diagram illustrating a configuration of a drive circuit for a semiconductor device according to a fifth embodiment of the present invention.

FIG. 5 is a circuit diagram illustrating a configuration of a drive circuit 5 for semiconductor device according to a fifth embodiment of the present invention. The drive circuit 5 corresponds to the drive circuit 3 according to the third embodiment with an initial power supply generation circuit 50 and a counter circuit 51 added thereto. Components identical or equivalent to those in the third embodiment will be described with the same reference numerals assigned thereto, and description will be focused on differences from the third embodiment, whereas description of common items will be simplified or omitted.

The drive circuit 5 is provided with the initial power supply generation circuit 50 and the counter circuit 51 as in the case of the first embodiment. The initial power supply generation circuit 50 can generate a power supply on the low-voltage side at the time of startup and the initial power supply generation circuit 50 can be stopped when an input signal HIN is turned ON a predetermined number of times by the counter circuit 51. This makes it possible to stabilize the power supply voltage for a predetermined period of time immediately after the startup.

The features and advantages of the present invention may be summarized as follows. According to the present invention, it is possible to reduce power consumption.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-155543, filed on Jul. 26, 2013 including specification, claims, drawings and summary, on which the Convention priority of the present application is based, is incorporated herein by reference in its entirety.

What is claimed is:

1. A drive circuit for a semiconductor device comprising:
an input terminal for receiving an input signal;
a first output terminal that outputs a drive signal generated from the input signal;
a control power supply terminal that is connected to a power supply generation device and receives a control power supply voltage from the power supply generation device;
a second output terminal that is connected to the power supply generation device and gives an output signal to the power supply generation device; and
a reset signal terminal that receives a first reset signal,
wherein upon receipt of the first reset signal, output of the drive circuit is stopped, and the power supply generation device reduces the control power supply voltage by adjusting the output signal.

2. The drive circuit according to claim 1, further comprising:
a level shift circuit;
a power supply control circuit that is provided before the level shift circuit, generates a pulse signal, outputs the pulse signal as the output signal and makes an on duty ratio of the output signal variable,
wherein the output signal is a drive signal of a switching device of the power supply generation device.

3. The drive circuit according to claim 2, wherein the power supply control circuit comprises:
an output duty variable circuit that can change the duty ratio of the pulse signal; and
an intermittent circuit that makes the output of the output duty variable circuit intermittent upon receipt of the first reset signal.

4. The drive circuit according to claim 1, further comprising an abnormality detection circuit that operates by the control power supply voltage and detects an abnormality in the drive circuit, wherein upon receipt of the first reset signal, the control power supply voltage is reduced down to a minimum operating voltage of the abnormality detection circuit.

5. The drive circuit according to claim 4,
wherein the abnormality detection circuit performs at least one of a first abnormality detection and a second abnormality detection,
the first abnormality detection is a detection whether or not the value of the control power supply voltage is a predetermined value or less, and
the second abnormality detection is a detection whether or not a temperature in the drive circuit is a predetermined value or above.

6. The drive circuit according to claim 1, further comprising an initial power supply generation circuit that is connected to the control power supply terminal and supplies a voltage to the control power supply terminal at a time of startup.

7. The drive circuit according to claim 6, further comprising a counter circuit that stops the initial power supply generation circuit when an input signal to the input terminal is turned ON a predetermined number of times.

8. The drive circuit according to claim 1,
wherein the power supply generation device comprises a converter circuit that includes a switching device and a power supply control circuit that generates a pulse signal to control the switching device and makes the on duty ratio of the pulse signal variable, and
the output signal is a second reset signal for causing the power supply control circuit to reduce the duty ratio of the pulse signal and/or make the pulse signal intermittent.

* * * * *